United States Patent
Puchner et al.

[11] Patent Number: 6,090,651
[45] Date of Patent: Jul. 18, 2000

[54] DEPLETION FREE POLYSILICON GATE ELECTRODES

[75] Inventors: Helmut Puchner, Santa Clara; Sheldon Aronowitz, San Jose; Gary K. Giust, Cupertino, all of Calif.

[73] Assignee: LSI Logic Corporation, Milpitas, Calif.

[21] Appl. No.: 09/434,340

[22] Filed: Nov. 5, 1999

[51] Int. Cl.$^7$ .............................................. H01L 21/8238
[52] U.S. Cl. ........................ 438/199; 438/188; 438/195; 438/929; 257/369; 257/204
[58] Field of Search ................................. 438/199, 188, 438/195, 929; 257/369; 254/204

[56] References Cited

U.S. PATENT DOCUMENTS

| | | | |
|---|---|---|---|
| 4,133,705 | 1/1979 | Andre | 148/171 |
| 4,717,688 | 1/1988 | Jaentsch | 437/120 |
| 5,770,512 | 6/1998 | Murakoshi et al. | 438/520 |
| 5,908,307 | 6/1999 | Talwar et al. | 438/199 |

OTHER PUBLICATIONS

S.M. Sze, Semiconductor Devices 1985, John Wiley & Sons pp. 329–332.

Primary Examiner—Matthew Smith
Assistant Examiner—Granvill D Lee

[57] ABSTRACT

A method of forming a supersaturated layer on a semiconductor device, where an initial phase layer is deposited on the semiconductor device. The initial phase layer has a solid phase dopant saturation level and a liquid phase dopant saturation level, where the liquid phase dopant saturation level is greater than the solid phase dopant saturation level. A concentration of a dopant is impregnated within the initial phase layers, where the concentration of the dopant is greater than the solid phase dopant saturation level and no more than about the liquid phase dopant saturation level. The initial phase layer is annealed, without appreciably heating the semiconductor device, using an amount of energy that is high enough to liquefy the initial phase layer over a melt duration. This dissolves the dopant in the liquefied initial phase layer. The amount of energy is low enough to not appreciably gasify or ablate the initial phase layer. The liquefied initial phase layer is cooled to freeze the dissolved dopant in a supersaturated, electrically activated concentration, thereby forming the supersaturated layer. An initial phase layer of either polysilicon or amorphous silicon may be deposited over a CMOS device. After laser annealing the initial phase layer with a melt duration of no more than about 100 nanoseconds, it is transformed into a doped polysilicon gate electrode that can be patterned and further processed.

20 Claims, 1 Drawing Sheet

DEPLETION FREE POLYSILICON GATE ELECTRODES

FIELD

This invention relates to the field of semiconductor processing. More particularly the invention relates to forming polysilicon gate electrodes for deep submicron CMOS devices.

BACKGROUND

As integrated circuit geometries shrink, the relationships between the individual elements of the circuits also tend to change. This situation tends to create pressure in two different areas. First, the individual elements themselves need to be fashioned according to smaller geometries, so as to support the overall reduced size of the integrated circuit. Second, the processes used to form the individual elements may need to be adjusted, as the traditional processing methods may have detrimental effects on the other elements of the integrated circuit, that are likewise smaller and more easily effected by adjoining elements and the other processes used to form the integrated circuit.

For example, in deep submicron CMOS devices, it is desirable to form gate electrodes with a thinner layer of material than that which is used for larger devices. However, as the thickness of the gate electrode is reduced, the conductivity of the gate electrode also tends to be reduced. This tends to reduce the efficiency of the gate electrode, which impacts the speed and other aspects of the device. In addition, the reduction in the overall amount of dopant in a thinner gate electrode tends to cause carrier depletion at the interface between the gate electrode and the gate dielectric. This situation additionally effects the ability of the device to perform.

As a further example, the gate electrodes of a deep submicron CMOS device are preferably spaced at reduced distances one from the other, in support of the overall reduced device geometry. However, the reduced distances between adjacent polysilicon gates tends to make them more difficult to fabricate. One reason for this is that one gate electrode over a complementary device may be oppositely doped in relation to another gate electrode over an adjoining complementary device. Before patterning the gate electrode layer, the reduced distance between the oppositely doped regions of the gate electrode layer tends to allow the dopants to diffuse into the adjoining regions. This tends to reduce or even destroy the intended effect of the dopants in the gate electrode regions, resulting in a degradation of the integrated circuit.

What is needed therefore, is a system whereby thin and closely spaced doped layers, such as polysilicon gate electrodes in deep submicron CMOS devices, have sufficient conduction and charge delivery properties.

SUMMARY

The above and other needs are met by a method of forming a supersaturated layer on a semiconductor device, where an initial phase layer is deposited on the semiconductor device. The initial phase layer has a solid phase dopant saturation level and a liquid phase dopant saturation level, where the liquid phase dopant saturation level is greater than the solid phase dopant saturation level.

A concentration of a dopant is impregnated within the initial phase layers, where the concentration of the dopant is greater than the solid phase dopant saturation level and no more than about the liquid phase dopant saturation level. The initial phase layer is annealed, without appreciably heating the semiconductor device, using an amount of energy that is high enough to liquefy the initial phase layer over a melt duration. This dissolves the dopant in the liquefied initial phase layer. The amount of energy is low enough to not appreciably gasify or ablate the initial phase layer. The liquefied initial phase layer is cooled to freeze the dissolved dopant in a supersaturated, electrically activated concentration, thereby forming the supersaturated layer.

The word "dissolve," as used at various points in this discussion, is a short hand method to describe the more complex actions taking place during the process. For example, it may not be technically correct to speak of a species "dissolving" at an atomic level. However, this word provides a good mental image of the process that is taking place, where the "dissolved" species is distributed through the "dissolving" medium, and is moved into an ordered orientation within the dissolving medium. However, as indicated by the word "dissolve," atomic species do tend to have solubility limits within different phases of different mediums. When an appropriate species is "dissolved" within an appropriate layer, the species is electrically activated. When it is not "dissolved," it may not be in the proper position to contribute to the conduction band, and thus tends to not be electrically activated. Thus, it is understood that when the word "dissolve" is used, it is in reference to this more complex process of the dopant species assuming a desired orientation in relation to the layer.

In a preferred embodiment, the initial phase layer is at least one of polysilicon or amorphous silicon that is deposited over a CMOS device or other polysilicon gate electrode transistor. After laser annealing the initial phase layer for a melt duration of no more than about 100 nanoseconds, the initial phase layer is transformed into a doped polysilicon gate electrode that can be patterned and further processed.

By heating only the initial phase layer, such as by performing the anneal with a laser, the thermal budget of the CMOS device is not expended. In other words, if the anneal was performed in a manner that heated other elements of the semiconductor device, those elements would tend to undergo physical changes as a result of the energy that they absorbed from the heat. For example, dopants impregnated near the junctions of the semiconductor device would tend to diffuse across the junctions, thus reducing the efficiency of the semiconductor device. If the amount of energy absorbed is sufficient over the entire processing of the semiconductor device, then the device can even be rendered inoperable.

Further, by liquefying the initial phase layer over so short a period of time, the dopant is dissolved in the liquefied layer, which it could not do in the solid phase layer, because the solid phase dopant saturation level is no more than about the liquid phase dopant saturation level. Further, upon the rapid cooling of the initial phase layer, made possible because other elements surrounding the initial phase layer, such as the semiconductor device, have not been heated, the dissolved dopant is quickly frozen within the initial phase layer. If the liquefied initial phase layer was allowed to cool more slowly, the dopant would tend to migrate out of the initial phase layer as it solidifies. The degree to which the dopant migrates is a function of several variables, such as anneal time and dopant species, as described more completely below. Preferably, the length of time used to anneal the initial phase layer is less than the length of time required for the dopant to migrate about 500 nanometers in the liquefied initial phase layer. Thus, a method according to the present invention produces a supersaturated layer, such as a polysilicon gate electrode.

Because the polysilicon gate electrode is supersaturated, it can be formed with a thickness that is much smaller than polysilicon gate electrodes formed by traditional processes. The reason for this is that the supersaturation of dopant tends to makes the layer more conductive per unit volume than another layer that is not supersaturated. Thus, the supersaturated layer can be formed as a thinner layer, and still have the conduction characteristics of a traditional thicker layer.

In other preferred embodiments the dopant is indium, which has a solid phase dopant saturation level of about $4\times(10)^{17}$ atoms/cm$^3$, and a liquid phase dopant saturation level is about $1\times(10)^{21}$ atoms/cm$^3$. The dopant is preferably impregnated with a concentration of about $1\times(10)^{21}$ atoms/cm$^3$. In a most preferred embodiment, the dopant impregnation is accomplished by ion implantation.

In a CMOS device with a polysilicon gate electrode, a concentration of an electrically activated dopant is dissolved within the polysilicon gate electrode, where the concentration of the dopant is greater than the solid phase dopant saturation level of the polysilicon gate electrode, and no more than about the liquid phase dopant saturation level of the polysilicon gate electrode. In this manner the polysilicon gate electrode is supersaturated with the dopant.

In an especially preferred embodiment, the invention is applied to first and second complimentary CMOS devices having first and second polysilicon gate electrodes respectively. A concentration of a p+ type dopant is dissolved within the first polysilicon gate electrode. The concentration of the electrically activated p+ type dopant is greater than the solid phase dopant saturation level of the first polysilicon gate electrode, and no more than about the liquid phase dopant saturation level of the first polysilicon gate electrode. Thus, the first polysilicon gate electrode is supersaturated with the p+ type dopant.

A concentration of an n+ type dopant is dissolved within the second polysilicon gate electrode. The concentration of the electrically activated n+ type dopant is greater than the solid phase dopant saturation level of the second polysilicon gate electrode, and no more than about the liquid phase dopant saturation level of the second polysilicon gate electrode. Thus, the second polysilicon gate electrode is supersaturated with the n+ type dopant. In this embodiment, the first supersaturated polysilicon gate electrode and the second supersaturated polysilicon gate electrode are no more than about 500 nanometers from each other.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
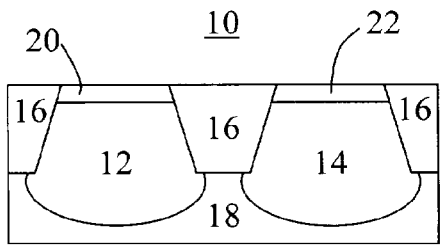
FIG. 1 depicts a cross-sectional view of the monolithic silicon portions of a pair of CMOS devices.

Referring now to FIG. 1, there are depicted portions of a pair of complementary semiconductor devices 10. Although applicable to broader range of devices, such as other polysilicon gate electrode devices, the applications of the present invention are described herein with reference to deep submicron CMOS integrated circuits. In the devices of FIG. 1, there is depicted the silicon substrate 18, in which have been formed n type well 12, p type well 14, oxide isolation trenches 16, p type threshold voltage layer 20, and n type threshold voltage layer 22.

Figure 2:
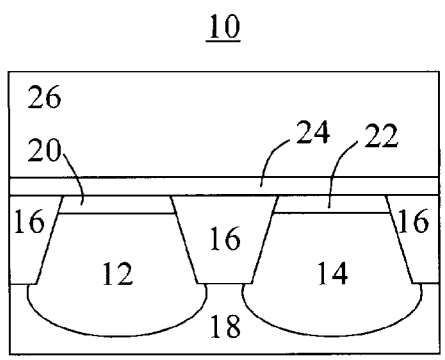
FIG. 2 depicts a cross-sectional view of the gate dielectric and gate electrode portions of a pair of CMOS devices.

In FIG. 2 a gate dielectric layer 24 has been deposited. Although described herein as an oxide layer, it is appreciated that gate dielectric layer 24 can be formed of oxides, such as silicon dioxide, other appropriate dielectric materials, or combinations of such materials. A gate electrode layer 26 is deposited over the gate dielectric layer 24, also as depicted in FIG. 2. The gate electrode layer 26 is preferably deposited as either amorphous silicon or polysilicon.

Figure 3:
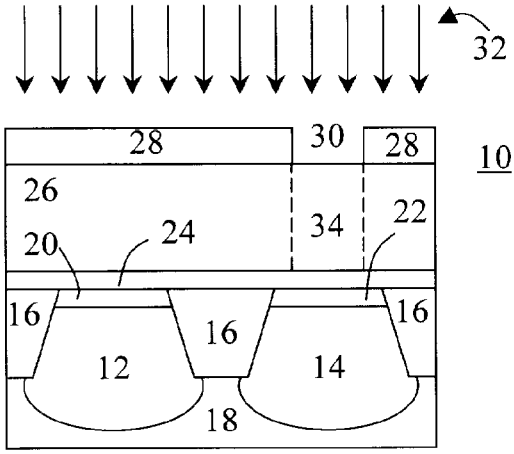
FIG. 3 depicts a first cross-sectional view of the masked gate electrode portion of a pair of CMOS devices.

After depositing the gate electrode layer 26, a photoresist layer 28 is deposited on top of the gate electrode layer 26, as depicted in FIG. 3. Either a positive or a negative photoresist may be used. The thickness of the photoresist is preferably sufficient to protect the gate electrode layer 26 during the doping of the gate electrode layer 26. This thickness depends on the process used to dope the gate electrode layer 26. For example, if ion implantation is used to dope the gate electrode layer 26, as in the preferred embodiment, then the thickness of the photoresist layer 28 is dependant on the implantation energy used during the implant process, and somewhat on the dopant implanted. Preferably, the thickness of the photoresist layer 28 is sufficient to protect the gate electrode layer 26 from being doped in all but the openings 30 for a wide variety of implantation energies and dopants.

The photoresist layer 28 is patterned with openings, such as opening 30. The opening 30 is used to define the area of the gate electrode layer 26 in which the gate electrodes for the device 10 are formed. As depicted in FIG. 3, the opening 30 overlies that portion 34 of the gate electrode layer 26 that is above the p type well 14. The gate electrode 34 for this device is formed within this region of the gate electrode layer 26. Through the opening 30, portion 34 of the gate electrode layer 26 is doped with a species selected for proper operation of the integrated circuits. In this example, portion 34 is doped n+, such as by using antimony, arsenic, or phosphorus.

The preferred method of doping portion 34 is via ion implantation, depicted by dopant stream 32. As can be seen in FIG. 3, the dopant stream accelerated toward the gate electrode layer 26 is masked by photoresist 28, except in the opening 30, where the dopant ions collide with the surface of the gate electrode layer 26 and penetrate into the gate electrode layer 26. The depth of the implant into the gate electrode layer 26 within the portion 34 is predetermined by setting the implant energy and other configurable parameters.

Figure 4:
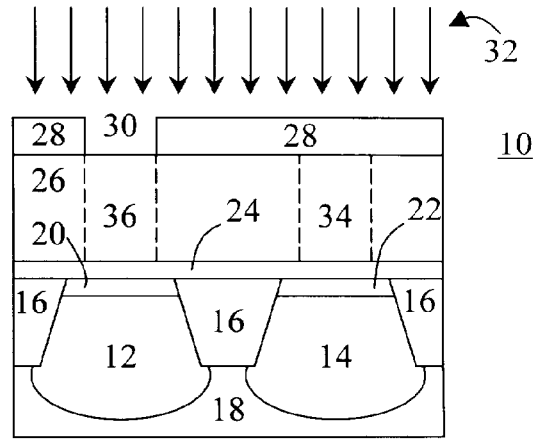
FIG. 4 depicts a second cross-sectional view of the masked gate electrode portion of a pair of CMOS devices.

Once the first portion 34 of the gate electrode layer 26 is doped as described above, the photoresist 28 is stripped off, and a new layer of photoresist 28 is deposited and patterned, such as is depicted in FIG. 4. In FIG. 4, the opening 30 is disposed so as to overlie a portion 36 of the gate electrode layer 26 that is above the n type well 12.

As described above, the opening 30 defines the area of the gate electrode layer 26 in which the gate electrode for the left hand device is formed. Through the opening 30, portion 36 of the gate electrode layer 26 is doped with a species selected for proper operation of the integrated circuits. In this example, portion 36 is doped p+, such as by using boron, indium, or aluminum.

As before, the preferred method of doping portion 36 is via ion implantation, depicted by dopant stream 32. As can be seen in FIG. 4, the dopant stream accelerated toward the gate electrode layer 26 is masked by photoresist 28, except in the opening 30, where the dopant ions collide with the surface of the gate electrode layer 26 and penetrate into the gate electrode layer 26. The depth of the implant into the gate electrode layer 26 within the portion 34 is predetermined by setting the implant energy and other configurable parameters, as described above.

Figure 5:
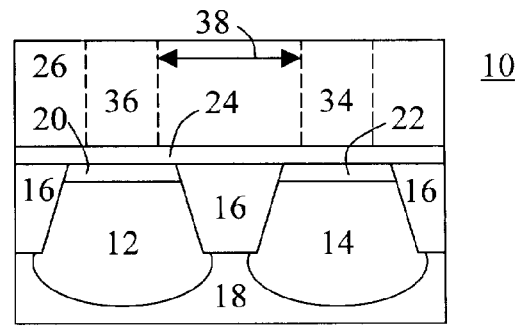
FIG. 5 depicts a cross-sectional and functional view of the annealing step for a pair of CMOS devices.

When the second layer of photoresist 28 is stripped away, as depicted in FIG. 5, there is left within the gate electrode layer 26 two implanted portions 34 and 36, each which has been impregnated with their respective dopants. As mentioned above, the dopant dose is selected to provide a dopant concentration within the portions 34 and 36 that is preferably at least as great as the solid phase dopant saturation level and no more than about the liquid phase dopant saturation level for the gate electrode layer 26. As mentioned above, the gate electrode layer 26 is preferably formed of amorphous silicon or polysilicon. Both the solid phase dopant saturation level and the liquid phase dopant saturation level for various dopants in either amorphous silicon or polysilicon can be either empirically determined or found in reference works such as *Solid Solubilities of Impurity Elements in Germanium and Silicon* (F. A. Trumbore, The Bell System Technical Journal, Vol. 39, pages 205–233, 1960).

Before the portions 34 and 36 are in a form in which they have the desired characteristics, they are preferably annealed to activate the dopant and remove the damage created by the dopant species during implantation. This is accomplished by annealing the gate electrode layer 26. Annealing is a process whereby energy is imparted to the gate electrode layer 26, which enables the silicon atoms to reorient into their desired crystal structure, and allows the impregnated dopant species to reorient within the crystal structure so that they can contribute carriers to the conduction band. Thus, the gate electrode layer 26 can be deposited as either amorphous silicon or polycrystalline silicon as desired, because the anneal of the gate electrode layer 26 tends to reorient either an amorphous silicon layer or a polysilicon layer, both of which are damaged during ion implantation, into a polysilicon layer. The polysilicon layer produced by the method described herein tends to have grains that are much finer than the conventionally annealed polysilicon in which the n and p type portions 34 and 36 are formed.

During the dopant phase, which as described above is preferably accomplished by ion implantation, as much of the dopant species as is practical can be implanted into the portions 34 and 36. However, the amount of dopant concentrated within the portions 34 and 36 greatly effects the performance of the device 10, and the selection of subsequent processes. As mentioned briefly above, a great enough concentration of dopant is required within the portions 34 and 36 so that there is not a carrier depletion within the gate electrode layer 26 near the interface of the gate electrode layer 26 and the gate dielectric layer 24 when the gate electrode layer 26 is biased during operation of the device 10, when it is completed.

However, with traditional processing, if the dopant concentration is too great within the portions 34 and 36, the dopant tends to diffuse out of the area in which it was implanted, and into other areas in which it is not intended to be. Further, by migrating to other areas, the over-concentration of dopant can reduce the efficiency of or even destroy the device, as described at various places above.

These problems are solved by the interaction of two major aspects of the preferred method according to the present invention. First, only the gate electrode layer 26 receives a substantial amount of energy during the post implant anneal. This creates two conditions which advance the interests of the present situation. The first condition is explained at this point, and the second condition is explained in more detail at a later point in this description.

First, because only the gate electrode layer 26 is heated to any substantial degree by the anneal energy, the gate electrode layer 26 cools very rapidly upon extinguishing the energy delivered to it during the anneal. The significance of this aspect is explained in greater detail below. Second, because only the gate electrode layer 26 is heated by the energy to any substantial degree, only the gate electrode layer 26 has sufficient energy to admit the dopant impregnated within it. In other words, the surrounding elements, such as the gate dielectric layer 24, do not receive sufficient energy during the anneal process to appreciably admit the dopant from the gate electrode layer 26.

The anneal that only imparts a significant amount of energy to the gate electrode layer 26 is also beneficial to the device 10 in other ways. Every doped semiconductor device tends to have a "thermal budget" in which it is preferably maintained in order to work at maximum efficiency. The thermal budget is determined as the amount of energy that the device can absorb before previously deposited doped layers interdiffuse to such an extent that the device starts to lose its desired junction and other properties. By annealing the gate electrode layer 26 in such a way that only the gate electrode layer 26 receives a significant amount of the energy imparted during the anneal, the thermal budget of the other elements within the device 10 is not expended in a way that is not beneficial to those other elements. Thus, the thermal budget can be expended in other ways that may enhance rather than detract from the operation of the other elements of the semiconductor device.

In a most preferred embodiment, the anneal is accomplished with a fast pulsing laser, such as an excimer laser. The energy of the laser, and other laser parameters as appropriate, are set so that the gate electrode layer 26 liquefies, the significance of which is described more completely below, when the second major aspect of the preferred method of the present invention is described. The laser parameters are also set so that other layers, such as the gate dielectric layer 20, are not appreciably heated. As the band gap of silicon dioxide, a material preferably selected for the gate dielectric layer 20, tends to be appreciably greater than the band gap of either amorphous silicon or polysilicon, the material preferably selected for the gate electrode layer 26, an excimer laser works well to liquefy the gate electrode layer 26 without melting the gate dielectric layer 24.

However, other aspects of the preferred method according to the present invention combine with this aspect to further enhance the utility of the method. In regard to the second major aspect of the method, alluded to above, the dose of the dopant impregnated into the gate electrode layer 26, such as by ion implantation described above, is selected to be between two distinct limits. By selecting a concentration of dopant between these two limits, the maximum benefit in balancing the competing interests at work in the process is found.

On the one hand, there is a desire to have as much dopant as possible, within practical limits, within the gate electrode layer 26 so that there is no charge depletion at the interface between the gate electrode layer 26 and the gate dielectric layer 24 during the operation of the device, as explained above. On the other hand, as the concentration of dopant within the gate electrode layer 26 increases, there is a increasing tendency for the dopant, such as undissolved dopant, to migrate to other elements within the device 10, and not stay within the gate electrode layer 26.

This problem of competing interests is solved in the preferred method of the present invention by a combination of at least two different aspects, introduced above. Only the gate electrode layer 26 receives sufficient energy to dissolve the dopant and does not allow it to diffuse out of the gate electrode layer 26, because of the short time of the thermal treatment.

This is accomplished by selecting for implant within the gate electrode layer 26 a dopant concentration that is at least equal to the solid phase dopant saturation level of the gate electrode layer 26 and no more than the liquid phase dopant saturation level of the gate electrode layer 26. As described above, the gate electrode layer 26 is preferably a solid at the time that the dopant is implanted within it. Thus, a concentration of dopant within the gate electrode layer 26 that is greater than the solid phase dopant saturation level is a greater concentration than the gate electrode layer 26 can structurally accommodate at that point in time. However, once implanted within the gate electrode layer 26, the dopant, the gate electrode layer 26, and the gate dielectric layer 24 all tend to have insufficient time and energy for the dopant to further diffuse into surrounding elements, such as the gate dielectric layer 24. Thus, the over concentration of dopant within the gate electrode layer 26 is not at this point in time an appreciable problem that effects the resulting efficiency of the integrated circuit 10.

During the post implant anneal, the gate electrode layer 26 is liquefied. Thus, with a dopant concentration that is also no more than about the liquid phase dopant saturation level of the gate electrode layer 26, the dopant, which together with the gate electrode layer 26 is sufficiently energized so as to be sufficiently mobile, is able to be dissolved within the liquefied gate electrode layer 26. However, two aspects tend to prevent the mobile dopant from entering other surrounding elements of the integrated circuit 10. First, the dopant is not chemically motivated to diffuse out of the liquefied gate electrode layer 26, because the concentration of the dopant within the liquefied gate electrode layer 26 is no more than about the concentration of dopant that the liquefied gate electrode layer 26 is able to dissolve. Second, because only the gate electrode layer 26 receives an appreciable amount of energy during the anneal, as described above, the still solid and relatively unenergized gate dielectric layer 24 is not a preferred destination for, and does not as readily admit, the mobilized dopant.

After the dopant is dissolved within the liquefied gate electrode layer 26, the flow of anneal energy to the gate electrode layer 26 is stopped, and the liquefied gate electrode layer 26 solidifies. Because the anneal method is selected to not appreciably heat the other elements of the integrated circuit 10, the liquefied gate electrode layer 26 solidifies very rapidly. This is because the thermal energy stored within the liquefied gate electrode layer 26 dissipates very quickly, because it is a relatively thin layer. Further, because the other elements of the integrated circuit 10 are not appreciably heated, they do not tend to keep the gate electrode layer 26 hot or slow the dissipation of thermal energy from the gate electrode layer 26. Conversely, because they did not receive an appreciable amount of thermal energy during the post implant anneal, the other elements of the integrated circuit 10 tend to draw thermal energy from the gate electrode layer 26, thus enhancing the rate at which the gate electrode layer 26 solidifies.

Proper selection of the dopant species used to activate the portions 34 and 36 of the gate electrode layer 26 can also help prevent the dopant from migrating out of the gate electrode layer 26 and into the other elements of the semiconductor device, such as the gate dielectric layer 24. For example, selection of a relatively large dopant species, such as indium, reduces the degree to which the dopant tends to diffuse out of the position which it assumes during the post implant anneal. This is because the size of the dopant atoms tends to restrict their ability to readily move within the gate electrode layer 26. Because the forces resisting the movement of a large atom are greater than the forces resisting the movement of a small atom, layers that are activated with large atoms tend to have a larger thermal budget than do layers that are activated with small atoms.

Thus, large dopant species both create a problem, and with the same property, prevent other problems. As to the problem created, large species are more difficult to activate, or in other words require that more energy be delivered during the post implant anneal in order for the dopant species to assume the proper position in the crystal structure. However, this problem is overcome in a preferred embodiment of a method according to the present invention, by liquefying the gate electrode layer 26 during the anneal. This provides sufficient energy for even a large dopant species, such as indium, to assume a proper orientation with the resultant structure. Not only does the laser activate the dopant to a higher level compared to conventional techniques, it also creates a more uniform doping distribution within the gate electrode layer 26, which minimizes depletion.

As mentioned, the use of a large dopant species, if it can be properly activated, also reduces problems at later points in processing, because of its large thermal budget. Just as a relatively large amount of energy is required to activate the larger dopant species, so also is a larger amount of energy required to displace them from their position within the layer. Thus, subsequent annealing, or other processes which impart energy in the form of heat to the structure, tend to have a smaller effect on the interdiffusion of a larger dopant species than on a smaller dopant species. Thus, this preferred method as described is able to take advantage of using larger dopant species, which are incompatible with traditional processing methods.

As an example of a preferred embodiment of the present invention, a gate electrode layer 26 of polysilicon is deposited with a thickness of about 2,000 angstroms using a chemical vapor deposition on a gate oxide layer 24. The gate electrode layer 26 is patterned with photoresist 28, and the n+ portion 34 is implanted with antimony in an ion implanter, using an energy of about 180 keV. The photoresist layer 28 is then stripped off, and a new photoresist layer 28 is applied, and the p+ portion 36 is implanted with indium in an ion implanter, using an energy of about 220 keV. The photoresist layer 28 is then stripped off, and the gate electrode layer 26 is laser annealed with an excimer laser operating at a fluence of from about 0.2 joules/cm$^2$ to about 2.0 joules/cm$^2$ with a pulse duration of from about 20 nanoseconds to about 40 nanoseconds. This fluence and laser pulse duration yields a melt duration of no more than about 100 nanoseconds.

The energy applied by the laser tends to determine how deeply the anneal energy is delivered within the gate electrode layer 26. For example, a greater laser energy tends to liquefy the gate electrode layer 26 to a greater depth and a lesser laser energy tends to liquefy the gate electrode layer 26 to a lesser depth. Thus, the energy setting for the laser is preferably based at least in part on the thickness of the gate electrode layer 26, and how close to the interface with the gate dielectric layer 24 it is desired to liquefy the gate electrode layer 26.

By liquefying the gate electrode layer 26 as close to the gate dielectric layer 24 as possible, a higher concentration of dopant is activated in the interface region, thus reducing the extend of carrier depletion. However, too great an energy tends to heat the gate dielectric layer 24, which may create other problems with the device, as described elsewhere herein. A xenon chloride excimer laser with a full width half maximum temporal pulse width of 35 nanoseconds operating at a fluence of about 1.13 joules/cm$^2$ will just completely melt a gate electrode layer 26 having a thickness of about 2,000 angstroms. A fluence of about 1.13 joules/cm$^2$ has been found to be a preferred upper limit to achieve balance in these goals.

The solidification time as given by the laser pulse during the post implant anneal tends to determine how far the implanted dopant species can diffuse prior to being frozen within the recrystallized gate electrode layer 26 upon cooling. It is desired that the dopant have sufficient time to be fully dissolved with the liquefied gate electrode layer 26, without any additional time for the dopant to migrate to any appreciably greater distance than necessary. In this manner, devices with the smallest degree of spacing 38 between gate electrodes 34 and 36 can be fabricated, and the least amount of contamination to other elements occurs. A melt duration of no more than about 100 nanoseconds has been found to be a preferred time to achieve balance in these goals across a range of dopants.

Because the preferred method of the present invention, as described above, allows the gate electrode layer 26 to solidify at such a quick rate, the dissolved dopant in the gate electrode layer 26 is quickly frozen into the locations it assumed within the liquefied gate electrode layer 26. Thus, the gate electrode layer 26, upon solidification, is supersaturated with the dopant species. However, the dopant is positioned within substitutional lattice sites and does not appreciably disrupt the polycrystalline nature of the silicon gate electrode layer 26. In these sites the dopant is able to provide the charge carriers needed for the intended operation of the gate electrode layer 26. Thus, even an extremely thin gate electrode layer 26, when formed by the method described above, tends to be sufficiently doped and does not experience charge depletion when biased.

A method according to the present invention, such as described above, allows for gate electrodes 34 and 36 of different types to be fabricated in very close proximity one to another. Typically, the gate electrodes 34 and 36 would need to be farther apart, or else the different dopant species would tend to interdiffuse between the portions 34 and 36 and counter dope the portions into which they interdiffused. However, because the anneal time is kept to a length of time that is only just sufficient to accomplish the goal of liquefying the gate electrode layer 26 and no longer, the dopants within portions 34 and 36 are not given sufficient time to laterally diffuse appreciably into the adjoining portion.

In one embodiment, this is accomplished by maintaining the melt duration used to perform the post implant anneal at a period of time of no more than about 100 nanoseconds, as described above. The separation distance 38 between the differently doped portions 34 and 36 tends to be dependent at least in part on the anneal time. This is because the distance through which the dopants impregnated within the portions 34 and 36 diffuse is dependent at least in part on the anneal time. Thus, the minimum spacing between the two gate electrodes 34 and 36 for a given anneal time can be calculated. Conversely, the maximum anneal time for a given spacing between the two gate electrodes 34 and 36 can also be calculated.

These calculations are based upon the distribution coefficient $c_{l/s}$ for a dopant species in silicon. The distribution coefficient is the atomic fraction of the dopant in solid phase silicon divided by the atomic fraction of the dopant in liquid phase silicon, which is approximated by the number of dopant atoms per cubic centimeter of the material in each of the solid and liquid phases. It is appreciated that this information can be determined for materials other than silicon. Distribution coefficients for a few dopants are given below in Table 1 by way of example:

TABLE 1

| Dopant | $c_{l/s}$ |
|---|---|
| Aluminum | 0.0020 |
| Boron | 0.80 |
| Indium | 0.0004 |
| Antimony | 0.023 |
| Arsenic | 0.3 |
| Phosphorus | 0.35 |

The solid solubilities for these and other dopants can be found in the literature, such as given above. Using the solid solubility and the distribution coefficient yields an estimate of the saturated liquid solubility. The saturated liquid solubility for the species recited in Table 1 are given in Table 2.

TABLE 2

| Dopant | Estimated Solid Solubility at 1400° C. (atoms/cm$^3$) | Estimated Saturated Liquid Solubility at 1400° C. (atoms/cm$^3$) |
|---|---|---|
| Aluminum | 2 × 10$^{18}$ | 1 × 10$^{21}$ |
| Boron | 6 × 10$^{20}$ | 8 × 10$^{20}$ |
| Indium | 4 × 10$^{17}$ | 1 × 10$^{21}$ |
| Antimony | 3 × 10$^{19}$ | 1 × 10$^{21}$ |
| Arsenic | 4 × 10$^{20}$ | 1 × 10$^{21}$ |
| Phosphorus | 3 × 10$^{20}$ | 9 × 10$^{20}$ |

The diffusion of the dopant through the liquefied gate electrode layer 26 can be approximated by:

$$C(x,t) = C_0 \mathrm{erfc}[x/4Dt)^{0.5}], \quad x > 0$$

where:
C0=initial concentration
x=distance from a confined region of high dopant concentration
D=diffusion coefficient
t=time The diffusion coefficient for various dopants are tabulated, such as in *Numerical Simulation of the Gas Immersion Laser Doping (GILD) Process in Silicon* (IEEE Trans. on Computer-Aided Design, Vol. 7, pages 205–214, 1988), and *Low-Temperature Fabrication of p+ n Diodes with 300 Å Junction Depth* (K. H. Weiner, P. G. Carey, A. M. McCarthy, and T. W. Sigmon, IEEE Elect. Dev. Lett., Vol. 13, pages 369–371, 1992).

For example, the diffusion coefficient of arsenic in molten silicon lies in the range of from about $10^{-5}$ to about $10^{-3}$ cm$^2$/sec, and the diffusion coefficient for boron is about $4(10)^{-4}$ cm$^2$/sec. Assuming a diffusion coefficient for arsenic of $10^{-3}$ cm$^2$/sec, and an anneal time of 100 nanoseconds, then the relative concentrations of arsenic in molten silicon at different distances from the implant region can be calculated, as given below:

TABLE 3

| x × (microns) | C(x, t)/C$_0$ |
|---|---|
| 0.125 | 3.8 × 10$^{-1}$ |
| 0.25 | 7.7 × 10$^{-2}$ |
| 0.5 | 4.1 × 10$^{-6}$ |
| 1.0 | 1.5 × 10$^{-12}$ |

In this example, there should not be any difficulty in constructing complementary gates on the same polysilicon or amorphous silicon gate electrode layer 26 at a distance 38 of at least 500 nanometers between implant portions 34 and 36, because the degree of diffusion for the implanted arsenic is so low at this distance. It is appreciated that this is by way of example only, and that other input parameters tend to yield different results.

For example, a greater anneal time (melt duration), such as given by a larger laser fluence, would tend to produce diffusion to a relatively greater degree, while a shorter anneal time, such as given by a smaller laser fluence, would tend to produce diffusion to a relatively smaller degree. Further, different species tend to have different diffusion rates, as described above. These parameters can be kept in mind when determining how far apart the gate electrodes 34 and 36 should be spaced in the integrated circuit 10. Conversely, these parameters can be adjusted as necessary when designing an integrated circuit 10 with a desired distance 38 between the gate electrodes 34 and 36.

In addition, the preferred method as described is particularly well adapted to using larger dopant species, because it is able to more fully activate the species than other methods, and the larger species tend to diffuse at a slower rate than do smaller species. Thus, the present method, by an interaction between the various elements of the method, is able to produce highly activated gate electrodes 34 and 36 that are spaced at a relatively small distance 38 one from another.

Figure 6:
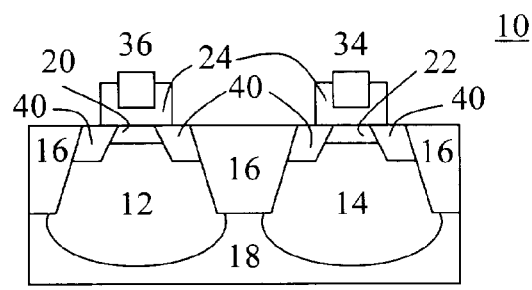
FIG. 6 depicts a cross-sectional view of the patterned gate electrode portion of a pair of CMOS devices.

FIG. 6 depicts in simplified form the complimentary devices with finished gate electrodes 34 and 36, and with source/drain areas 40. It is appreciated that one of the gate electrodes 34 or 36 may be formed with the method as described above, while the other of the gate electrodes 34 or 36 is formed with a conventional method.

It is appreciated that the invention as described above comprehends numerous adaptations, rearrangements, and substitutions of parts, all of which are considered to be within the scope and spirit of the invention as described, and that the scope of the invention is only to be restricted by the language of the claims given below.

What is claimed is:

1. A method of forming a supersaturated layer on a semiconductor device, comprising:

depositing an initial phase layer on the semiconductor device, the initial phase layer having a solid phase dopant saturation level and a liquid phase dopant saturation level, where the liquid phase dopant saturation level is greater than the solid phase dopant saturation level, impregnating a concentration of a dopant within the initial phase layer, where the concentration of the dopant is greater than the solid phase dopant saturation level and no more than about the liquid phase dopant saturation level, annealing the initial phase layer without appreciably heating the semiconductor device, using an amount of energy high enough to liquefy the initial phase layer over a melt duration, thereby dissolving the dopant in the liquefied initial phase layer, where the amount of energy is low enough to not appreciably gasify or ablate the initial phase layer, and cooling the liquefied initial phase layer to freeze the dissolved dopant in a supersaturated, electrically activated concentration, thereby forming the supersaturated layer.

2. The method of claim 1 wherein the supersaturated layer further comprises a gate electrode.

3. The method of claim 1 wherein the supersaturated layer further comprises polysilicon.

4. The method of claim 1 wherein the supersaturated layer has a thickness of between about 100 angstroms and about 3,000 angstroms.

5. The method of claim 1 wherein the initial phase layer further comprises at least one of polysilicon and amorphous silicon.

6. The method of claim 1 wherein the semiconductor device further comprises a CMOS device.

7. The method of claim 1 wherein the step of impregnating the initial phase layer with the dopant further comprises ion implanting the dopant into the initial phase layer.

8. The method of claim 1 wherein the step of annealing the initial phase layer further comprises laser annealing the initial phase layer with a fast pulsing laser.

9. The method of claim 1 wherein the step of annealing the initial phase layer further comprises annealing the initial phase layer with an excimer laser using a fluence of between about 0.2 joules/cm$^2$ and about 2.0 joules/cm$^2$.

10. The method of claim 1 wherein the melt duration of the anneal for the initial phase layer is no more than about 100 nanoseconds.

11. The method of claim 1 wherein the melt duration of the anneal for the initial phase layer is no more than a length of time required for the dopant to migrate about 500 nanometers in the liquefied initial phase layer.

12. A method of forming a supersaturated polysilicon gate electrode on a CMOS semiconductor device, comprising:

depositing an initial phase silicon gate layer on the CMOS semiconductor device, the initial phase silicon gate layer having a solid phase dopant saturation level and a liquid phase dopant saturation level, where the liquid phase dopant saturation level is greater than the solid phase dopant saturation level, ion implanting a concentration of a dopant within the initial phase silicon gate layer, where the concentration of the dopant is greater than the solid phase dopant saturation level and no more than about the liquid phase dopant saturation level, laser annealing the initial phase silicon gate layer without appreciably heating the semiconductor device, using an amount of energy high enough to liquefy the initial phase layer for no more than about 100 nanoseconds, thereby dissolving the dopant in the liquefied initial phase silicon gate layer, where the amount of energy is low enough to not appreciably gasify or ablate the initial phase silicon gate layer, and cooling the liquefied initial phase silicon gate layer to freeze the dissolved dopant in a supersaturated, electrically activated concentration, thereby forming the supersaturated polysilicon gate electrode.

13. The method of claim 12 wherein the initial phase silicon gate layer further comprises at least one of polysilicon and amorphous silicon.

14. The method of claim 12 wherein the step of laser annealing is accomplished with a fast pulsing laser.

15. The method of claim 12 further comprising:

forming the supersaturated polysilicon gate electrode with two active portions, a first of the two active portions impregnated with a p+ type dopant and a second of the two active portions impregnated with an n+ type dopant, the two active portions of the supersaturated polysilicon gate electrode respectively overlying first and second complimentary CMOS semiconductor devices, and the two active portions of the supersaturated polysilicon gate electrode disposed no more than about 500 nanometers from each other, and patterning the two active portions of the supersaturated polysilicon gate electrode to form separate first and second supersaturated polysilicon gate electrodes, the first supersaturated polysilicon gate electrode supersaturated with the n+ type dopant, and the second supersaturated polysilicon gate electrode supersaturated with the p+ type dopant.

16. The method of claim 12 wherein the supersaturated polysilicon gate electrode has a thickness of between about 100 angstroms and about 3,000 angstroms.

17. A CMOS device having a polysilicon gate electrode, the polysilicon gate electrode having a solid phase dopant saturation level and a liquid phase dopant saturation level, and a concentration of an electrically activated dopant dissolved within the polysilicon gate electrode, the improvement comprising the concentration of the electrically activated dopant is greater than the solid phase dopant saturation level of the polysilicon gate electrode and no more than about the liquid phase dopant saturation level of the polysilicon gate electrode so that the polysilicon gate electrode is supersaturated with the dopant.

18. The device of claim 17 wherein the supersaturated polysilicon gate electrode has a thickness of between about 100 angstroms and about 3,000 angstroms.

19. First and second complimentary CMOS devices having first and second polysilicon gate electrodes respectively, the improvement comprising:

a concentration of a p+ type dopant dissolved within the first polysilicon gate electrode, where the concentration of the p+ type dopant is greater than the solid phase dopant saturation level of the first polysilicon gate electrode and no more than about the liquid phase dopant saturation level of the first polysilicon gate electrode so that the first polysilicon gate electrode is supersaturated with the p+ type dopant, a concentration of an n+ type dopant dissolved within the second polysilicon gate electrode, where the concentration of the n+ type dopant is greater than the solid phase dopant saturation level of the second polysilicon gate electrode and no more than about the liquid phase dopant saturation level of the second polysilicon gate electrode so that the second polysilicon gate electrode is supersaturated with the n+ type dopant, and the first supersaturated polysilicon gate electrode and the second supersaturated polysilicon gate electrode are about 500 nanometers from each other.

20. The device of claim 19 wherein the first and second supersaturated polysilicon gate electrodes each have a thickness of between about 100 angstroms and about 3,000 angstroms.

* * * * *